US009607995B2

(12) United States Patent
Ju et al.

(10) Patent No.: US 9,607,995 B2
(45) Date of Patent: Mar. 28, 2017

(54) SEMICONDUCTOR STRUCTURE AND FABRICATION METHOD THEREOF, AND STATIC RANDOM ACCESS MEMORY CELL

(71) Applicant: Semiconductor Manufacturing International (Shanghai) Corporation, Shanghai (CN)

(72) Inventors: Jianhua Ju, Shanghai (CN); Shaofeng Yu, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/986,979

(22) Filed: Jan. 4, 2016

(65) Prior Publication Data
US 2016/0197085 A1 Jul. 7, 2016

(30) Foreign Application Priority Data
Jan. 6, 2015 (CN) .......................... 2015-1-0006068

(51) Int. Cl.
| H01L 21/00 | (2006.01) |
| H01L 21/84 | (2006.01) |
| H01L 27/11 | (2006.01) |
| H01L 21/326 | (2006.01) |
| H01L 29/66 | (2006.01) |
| H01L 29/78 | (2006.01) |
| H01L 21/8234 | (2006.01) |
| H01L 27/088 | (2006.01) |
| H01L 21/8238 | (2006.01) |
| H01L 27/092 | (2006.01) |

(52) U.S. Cl.
CPC ........ *H01L 27/1104* (2013.01); *H01L 21/326* (2013.01); *H01L 21/823431* (2013.01); *H01L 21/823456* (2013.01); *H01L 27/0886* (2013.01); *H01L 29/66545* (2013.01); *H01L 29/7848* (2013.01); *H01L 29/7855* (2013.01); *H01L 21/82385* (2013.01); *H01L 21/823821* (2013.01); *H01L 21/823871* (2013.01); *H01L 27/0924* (2013.01); *H01L 27/1116* (2013.01)

(58) Field of Classification Search
CPC ..................... H01L 21/823821; H01L 27/1104
USPC ......................................................... 438/164
See application file for complete search history.

(56) References Cited

U.S. PATENT DOCUMENTS

2012/0032732 A1    2/2012  Xiao et al.

*Primary Examiner* — David S Blum
(74) *Attorney, Agent, or Firm* — Anovo Law Group, PLLC (57) ABSTRACT

A method for forming a semiconductor having a plurality of FinFETs. The method includes providing a semiconductor substrate having a surface; and forming a plurality of first fins and a plurality of second fins on the surface of the semiconductor substrate. Further, the method also includes forming a mask layer on top surfaces of the plurality of first fins and the plurality of second fins; and forming an insulation material layer covering side surfaces of the first fins, the second fins and the mask layer. Further, the method includes removing a portion of the mask layer on the first fins; and forming a continuous first gate structure covering side and top surfaces of a plurality of first fins and a discontinuous second gate structure covering only the side surfaces of the second fins and the side surfaces of the mask layer.

10 Claims, 11 Drawing Sheets

SEMICONDUCTOR STRUCTURE AND FABRICATION METHOD THEREOF, AND STATIC RANDOM ACCESS MEMORY CELL

CROSS-REFERENCES TO RELATED APPLICATIONS

This application claims the priority of Chinese patent application No. 201510006068.5, filed on Jan. 6, 2015, the entirety of which is incorporated herein by reference.

FIELD OF THE INVENTION

The present invention generally relates to the field of semiconductor manufacturing technology and, more particularly, relates to semiconductor structures and fabrication processes thereof, and static random access memory cells.

BACKGROUND

With the continuous development of the semiconductor fabrication technologies and the continuous shrinking of the technical node, to obtain a desired threshold voltage and improve the performance of semiconductor devices, the gate-last technique has been widely used. However, when the critical dimension of the semiconductor device is further reduced, the structure of the conventional Metal Oxide Semiconductor Field Effect Transistor (MOSFET) is unable to match the desired performance requirements even the gate-last process is used. Thus, multiple-gate devices, such as Fin field effect transistors (FinFETs), etc., have attracted extensive attentions.

During the fabrication of FinFETs, it needs to adjust the threshold voltages of the FinFETs to match certain requirements of a practical integrated circuit (IC). One approach to adjust the threshold voltages of the FinFETs is to dope the channel regions of the FinFETs. The widths of the fins of the FinFETs are relatively small. Thus, it needs to dope the fins with a relatively high doping concentration to obtain the desired threshold voltages. However, performing a doping process with the relatively high doping concentration in the fins would affect the carrier mobility of the channel regions of the FinFETs. Further, under a same doping concentration, the variation of the doping concentrations within the channel regions would cause threshold voltage mismatches between different FinFETs.

Another approach to adjust the threshold voltages of the FinFETs is to form work function layers in metal gates of the FinFETs. By adjusting the work functions of the metal gates by changing metal gate stack, the threshold voltages of the FinFETs are able to be adjusted. However, the required work functions of P-type FinFETs and N-type FinFETs are different. Thus, it needs to form different metal gate stack for the P-type FinFETs and the N-type FinFETs, respectively. For similar P-type FinFETs or similar N-type FinFETs, to obtain FinFETs with different threshold voltages, it needs different fabrication processes to form different work function layers. Thus, the fabrication process is complex; and the fabrication process is difficult to control.

The disclosed device structures and methods are directed to solve one or more problems set forth above and other problems.

BRIEF SUMMARY OF THE DISCLOSURE

One aspect of the present disclosure includes providing a method for fabricating a semiconductor structure having a plurality of FinFETs. The method includes providing a semiconductor substrate having a surface; and forming a plurality of first fins and a plurality of second fins on the surface of the semiconductor substrate. Further, the method also includes forming a mask layer on top surfaces of the plurality of first fins and the plurality of second fins; and forming an insulation material layer covering side surfaces of the first fins, the second fins and the mask layer. Further, the method includes removing a portion of the mask layer on the first fins; and forming a continuous first gate structure covering side and top surfaces of a plurality of first fins and a discontinuous second gate structure covering only side surfaces of the second fins and the side surfaces of the mask layer.

Another aspect of the present disclosure includes providing a semiconductor structure having a plurality of FinFETs. The semiconductor structure includes a semiconductor substrate having a surface; and a plurality of first fins and a plurality of second fins formed on the surface of the semiconductor substrate. The semiconductor structure also includes a mask layer formed on top surfaces of the second fins; and a continuous first gate structure covering side and top surfaces of the plurality of first fins. Further, the semiconductor structure includes a discontinuous second gate structure covering only side surfaces of the second fins and the mask layer. Wherein one portion the discontinuous second gate structure on one side surface of the second fin is used as a back-gate of a FinFET having the second gate structure and the second fin for adjusting a threshold voltage of the FinFET.

Another aspect of the present disclosure includes providing a static random access memory (SRAM) cell. The static random access memory (SRAM) cell includes a pass-gate transistor having a fin, a mask layer covering a portion of a top surface of the fin, and a back-gate and a gate covering portions of two side surfaces of the fin, respectively. The static random access memory (SRAM) cell also includes a pull-up transistor, of which a source is electrically connected with the back-gate of the pass-gate transistor for providing a back bias to adjust a threshold voltage of the pass-gate transistor; and a pull-down transistor Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 24:
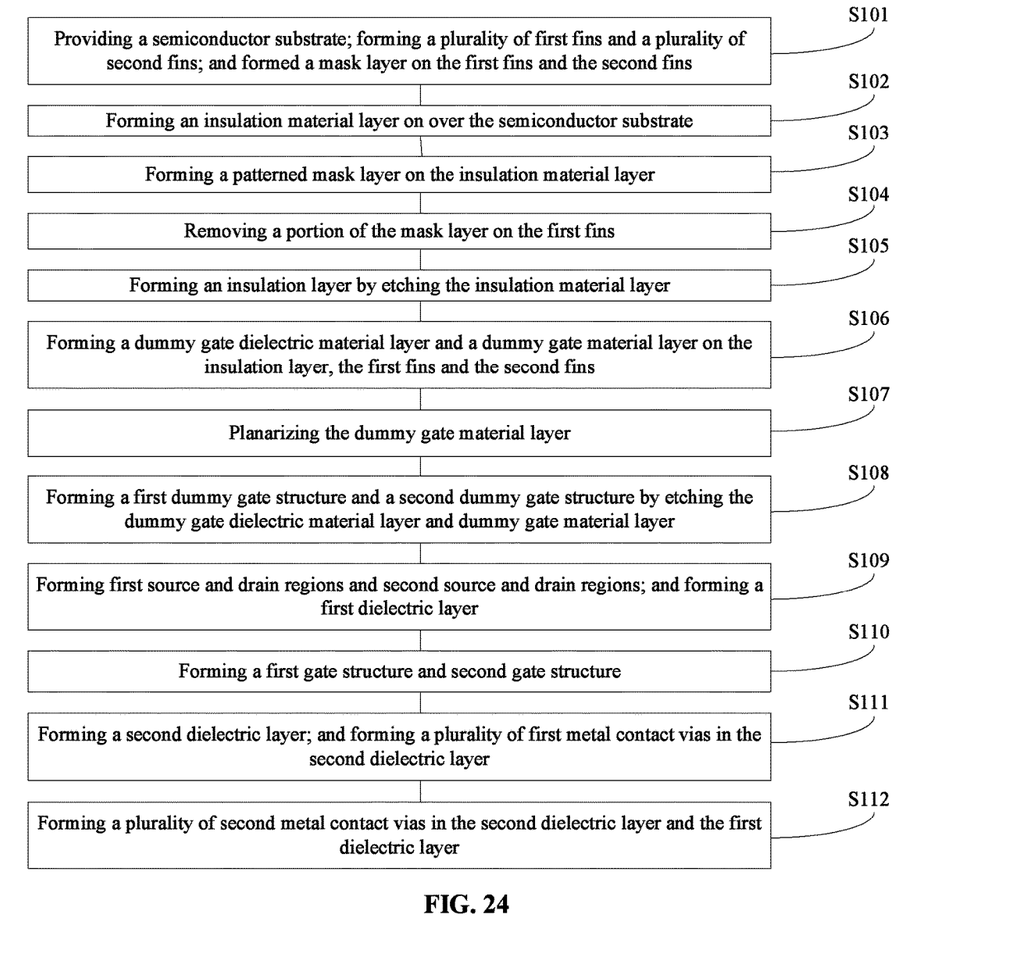
FIG. 24 illustrates an exemplary fabrication process of a semiconductor structure having a plurality of FinFETs consistent with the disclosed embodiments.

FIG. 24 illustrates an exemplary fabrication process of a semiconductor structure having a plurality of FinFETs consistent with the disclosed embodiments. FIGS. 1~19 illustrate semiconductor structures corresponding certain stages of the exemplary fabrication process.

Figure 1:
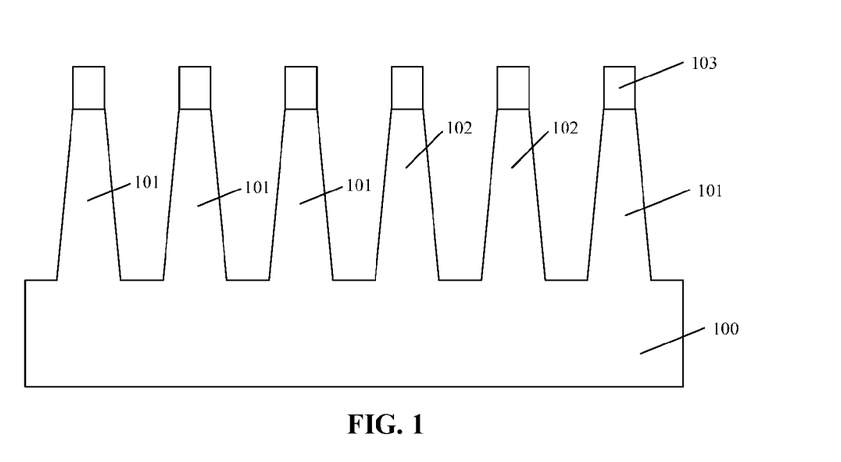
FIGS. 1~19 illustrate semiconductor structures corresponding to certain stages of an exemplary fabrication process of a semiconductor structure having a plurality of FinFETs consistent with the disclosed embodiments.

As shown in FIG. 24, at the beginning of fabrication process, a substrate with certain structures is provided (S101). FIG. 1 illustrates a corresponding semiconductor structure.

As shown in FIG. 1, a semiconductor substrate 100 is provided. A plurality of first fins 101 and a plurality of second fins 102 are formed on a surface of the semiconductor substrate 100. For illustrative purposes, fourth first fins 101 and two second fins 102 are shown. Further, a mask layer 103 is formed on the top surfaces of the first fins 101 and the second fins 102.

The semiconductor substrate 100 may be made of any appropriate semiconductor materials, such as single crystal silicon, polysilicon, silicon on insulator (SOI), silicon germanium, carborundum, indium antimonite, lead telluride, indium arsenide, indium phosphate, gallium arsenide, gallium antimonite, alloy semiconductor or a combination thereof. In one embodiment, the semiconductor substrate 100 is made of single crystal silicon. The semiconductor substrate 100 provides a base for subsequent devices and processes.

In one embodiment, a process for forming the first fins 101 and the second fins 102 may include forming the mask layer 103 on a surface of the semiconductor substrate 100. The mask layer 103 may cover portions of the semiconductor substrate 100. The method also includes etching the semiconductor substrate 100 using the mask layer 103 as an etching mask. Thus, the first fins 101 and the second fins 102 may be formed.

The mask layer 103 may be made of any appropriate material, such as silicon oxide, silicon nitride, or silicon oxynitride, etc. In one embodiment, the mask layer 103 is made of silicon nitride. The thickness of the mask layer 103 may be in a range of approximately 500 Å~600 Å.

Various processes may be used to form the mask layer 103, such as a chemical vapor deposition (CVD) process, a physical vapor deposition (PVD) process, an atomic layer deposition (ALD) process, a flowable CVD (FCVD) process, or an epitaxial growth process, etc. Various processes may be used to etch the semiconductor substrate 100, such as a dry etching process, a wet etching process, or an ion beam etching process, etc.

In certain other embodiments, the first fins 101 and the second fins 102 may be formed by depositing a semiconductor layer on the semiconductor substrate 100; and followed by patterning the semiconductor layer. The semiconductor layer may be made of any appropriate semiconductor material, such as silicon, germanium, silicon germanium, carborundum, indium antimonite, lead telluride, indium arsenide, indium phosphate, gallium arsenide, gallium antimonite, alloy semiconductor or a combination thereof.

Various processes may be used to form the semiconductor layer, such as a CVD process, an ALD process, or an epitaxial growth process, etc. Various processes may be used to etch the semiconductor layer, such as a dry etching process, a wet etching process, or an ion beam etching process, etc.

Figure 2:
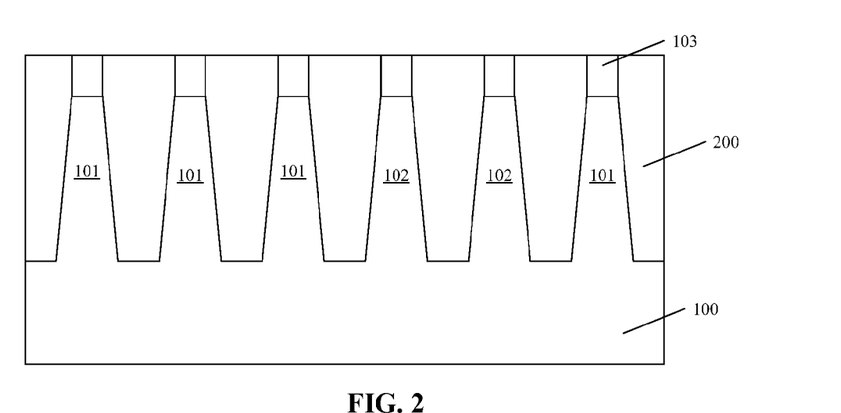

Returning to FIG. 24, after forming the plurality of first fins 101 and the plurality of second fins 102, an insulation material layer may be formed (S102). FIG. 2 illustrates a corresponding semiconductor structure.

As shown in FIG. 2, an insulation material layer 200 is formed on the semiconductor substrate 100. The top surface of the insulation material layer 200 may level with the top surface of the mask layer 103. The insulation material layer 200 may cover the side surfaces of the first fins 101, the second fins 102, and the mask layer 103. The insulation material layer 200 may be used to subsequently form an insulation layer to insulation adjacent fins.

A process for forming the insulation material layer 200 may include forming an insulation material film over the surface of the semiconductor substrate 200, the first fins 101, the second fins 102, and the mask layer 103; and followed by planarizing the insulation material film using the mask layer 103 as a stop layer. Thus, the insulation material layer 200 may be formed.

The insulation material film may be made of any appropriate material, such as silicon oxide, silicon oxynitride, or porous silicon oxide, etc. Various processes may be used to form the insulation material film, such as a CVD process, a PVD process, or an FCVD process, etc. The insulation material film may be planarized by any appropriate process, such as a chemical mechanical polishing (CMP) process, or a physical mechanical polishing process, etc.

Referring to FIG. 2, in one embodiment, the top surface of the insulation material layer 200 levels with the top surface of the mask layer 103. Such a structure may facilitate the subsequent formation of a patterned mask layer.

Figure 3:
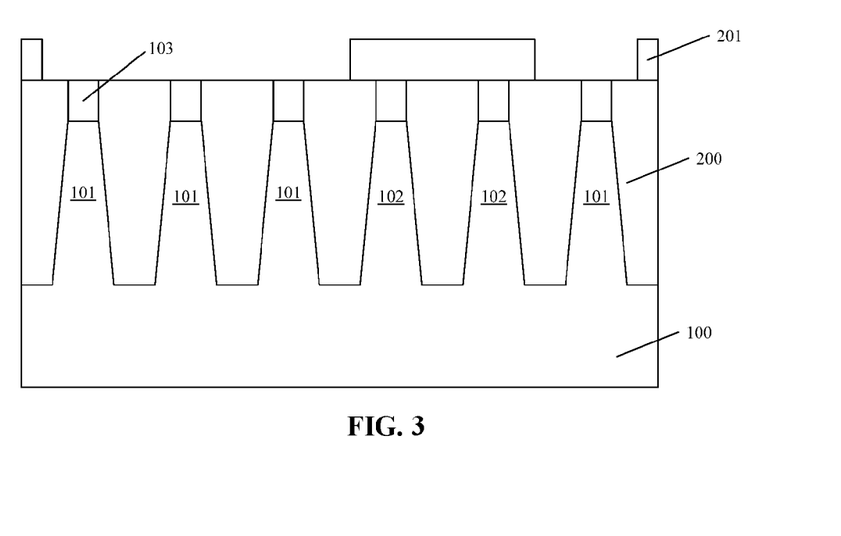

Returning to FIG. 24, after forming the insulation material layer 200, a patterned mask layer may be formed (S103). FIG. 3 illustrates a corresponding semiconductor structure.

As shown in FIG. 3, a patterned mask layer 201 is formed on the insulation material layer 200 and portions of the mask layer 103. The patterned mask layer 201 may have a plurality of openings (not labeled); and the plurality of openings may expose the mask layer 103 on the first fins 101, and portions of the insulation material layer 200 around the first fins 101.

The patterned mask layer 201 may be made of any appropriate material, such as photoresist, or amorphous carbon, etc. In one embodiment, the patterned mask layer 201 is a patterned photoresist layer.

A process for forming the patterned mask layer 201 made of photoresist may include forming a photoresist layer on the mask layer 103 and the insulation material layer 200 by a spin-coating process; and followed by exposing the photoresist layer and developing the exposed photoresist layer. Thus, the patterned mask layer 201 having the plurality of openings may be formed.

As shown in FIG. 3, the openings may expose the portion of the mask layer 103 on the first fins 101. The openings may also expose portions of the insulation material layer 200 at both sides of the first fins 101. The widths of the openings may be increased. Thus, the difficulty for forming the openings may be reduced.

Figure 4:
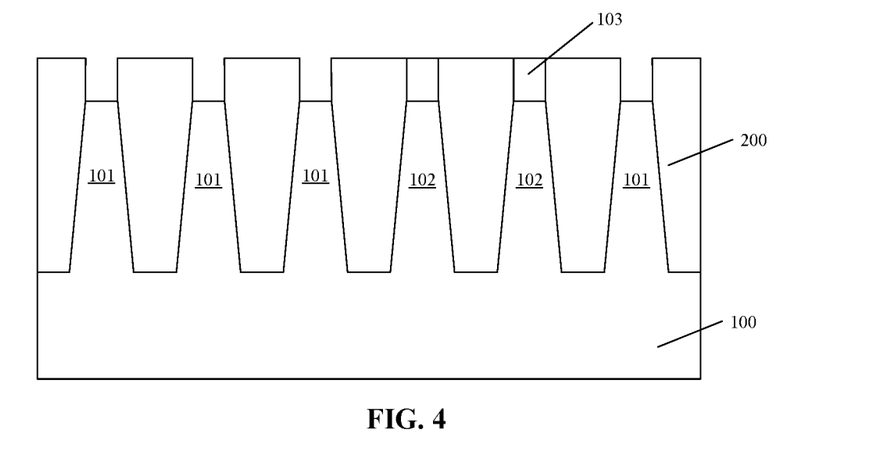

Returning to FIG. 24, after forming the patterned mask layer 201, a portion of the mask layer 103 may be removed (S104). FIG. 4 illustrates a corresponding semiconductor structure.

As shown in FIG. 4, a portion of the mask layer 103 on the top surfaces of the first fins 101 is removed. The portion of the mask layer 103 on the top surfaces of the first fins 101 may be removed by etching the portion of the mask layer 103 on the top surfaces of the first fins 101 using the patterned mask layer 201 as an etching mask. After removing the portion of the mask layer 103 on the first fins 101, the top surfaces of the fins 101 may be exposed. Thus, the subsequently formed first gate structure on the first fins 101 may be able to cover the top surfaces of the first fins 101.

The portion of the mask layer 103 on the top surfaces of the first fins 101 may be removed by any appropriate process, such as a dry etching process, or a wet etching process, etc. In one embodiment, a wet etching process is used to remove the portion of the mask layer 103 on the top surfaces of the first fins 101. The etching solution of the wet etching process may be a phosphorous acid solution. The wet etching process may have a relatively high etching selectivity to the mask layer 103. Thus, the wet etching process may not etch the exposed portion of the insulation material layer 200 during the process for removing the portion of the mask layer 103.

After removing the portion of the mask layer 103 on the top surfaces of the first fins 101, the patterned mask layer 201 may be removed. The patterned mask layer 201 may be removed by any appropriate process, such as a wet etching process, a dry etching process, or a plasma ashing process, etc.

Figure 5:
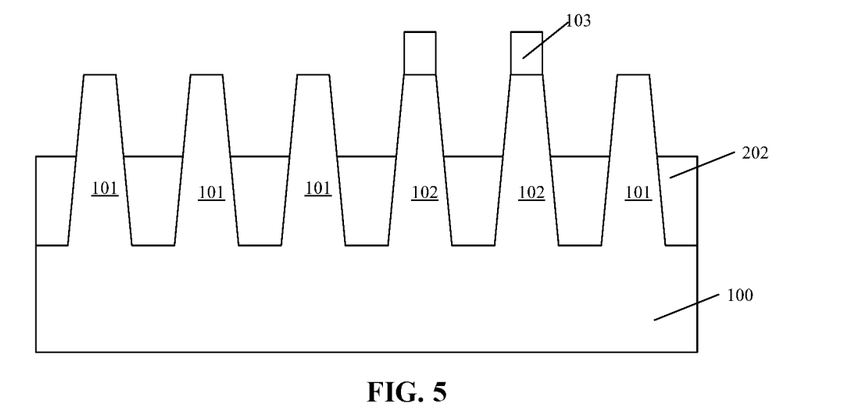

Returning to FIG. 24, after removing the portion of the mask layer 103 on the top surfaces of the first fins 130, an insulation layer may be formed (S105). FIG. 5 illustrates a corresponding semiconductor structure.

As shown in FIG. 5, an insulation layer 202 is formed. The insulation layer 202 may be formed by performing an etch-back process on the insulation material layer 200 to cause the top surface of the insulation material layer 200 to be lower than the top surfaces of the first fins 101 and the second fins 102.

The etch-back process may be a dry etching process, or a wet etching process, etc. After the etch-back process, portions of the side surfaces of the first fins 101 and portions of the side surfaces of the second fins 102 may be exposed.

The insulation layer 202 may be configured as an insulation structure between the adjacent first fins 101, the adjacent second fins 102 and the adjacent first fin 101 and second fin 102. The insulation layer 202 may also be configured as an insulation structure between the semiconductor substrate 100 and the subsequently formed first gate structures and second gate structures.

Figure 6:
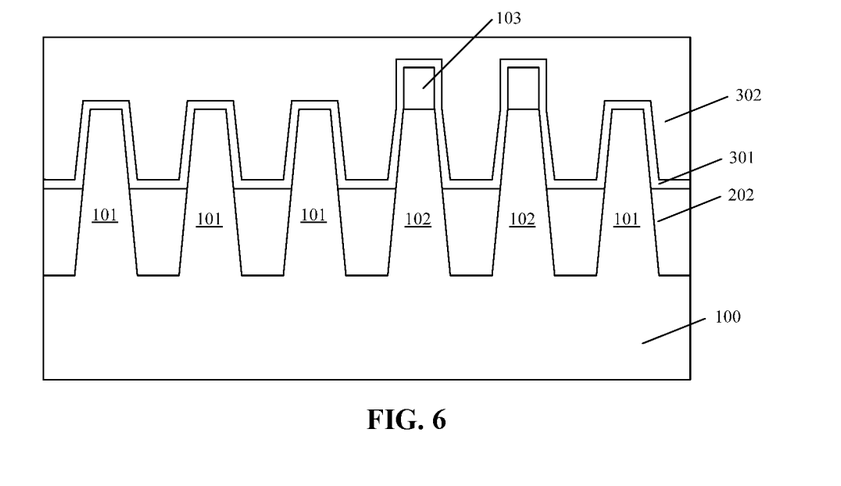

Returning to FIG. 24, after forming the insulation layer 202, a dummy gate dielectric material layer and a dummy gate material layer may be formed (S106). FIG. 6 illustrates a corresponding semiconductor structure.

As shown in FIG. 6, a dummy gate dielectric material layer 301 is formed. The dummy gate dielectric material layer 301 may cover the insulation layer 202, the first fins 101, the second fins 102 and the mask layer 103. Further, a dummy gate material layer 302 may be formed on the dummy gate dielectric material layer 301. The dummy gate dielectric material layer 301 and the dummy gate material layer 302 may be subsequently used to form first dummy gate structures and second dummy gate structures.

The dummy gate dielectric material layer 301 may be made of any appropriate material, such as silicon oxide, or silicon nitride, etc. Various processes may be used to form the dummy gate dielectric material layer 301, such as a CVD process, a PVD process, an FCVD, or an ALD process, etc.

The dummy gate material layer 302 may be made of any appropriate material, such as polysilicon, etc. Various processes may be used to form the dummy gate material layer 302, such as a CVD process, an FCVD, an ALD process, or a furnace process etc.

In certain other embodiments, the dummy gate dielectric material layer 301 may be omitted. Thus, the dummy gate material layer 302 may cover the insulation layer 202, the first fins 101, the second fins 102, and the mask layer 103.

Figure 7:
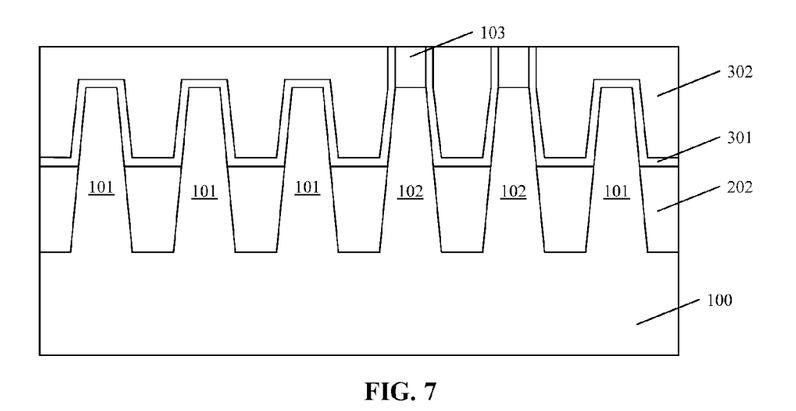

Returning to FIG. 24, after forming the dummy gate material layer 302, a planarization process may be performed (S107). FIG. 7 illustrates a corresponding semiconductor structure.

As shown in FIG. 7, a planarization process is performed to remove a portion of the dummy gate material layer 302 using the top surface of the mask layer 103 as a stop layer; and the top surface of the mask layer 103 on the second fins 102 may be exposed.

The planarization process may be a chemical mechanical polishing process, or a physical mechanical polishing process, etc. In one embodiment, a chemical mechanical polishing process is used to planarize the dummy gate material layer 302.

Figure 8:
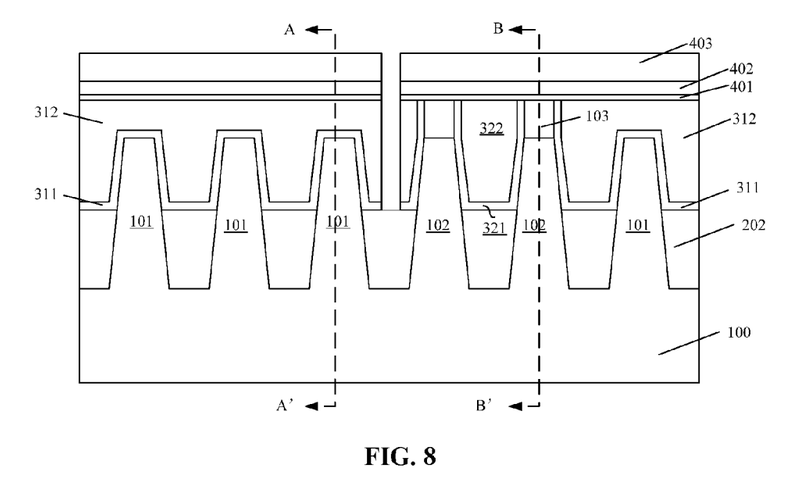
Figure 9:
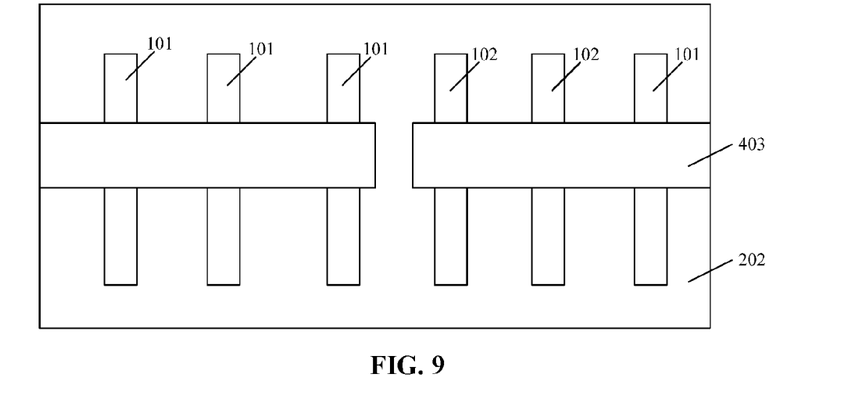
Figure 10:
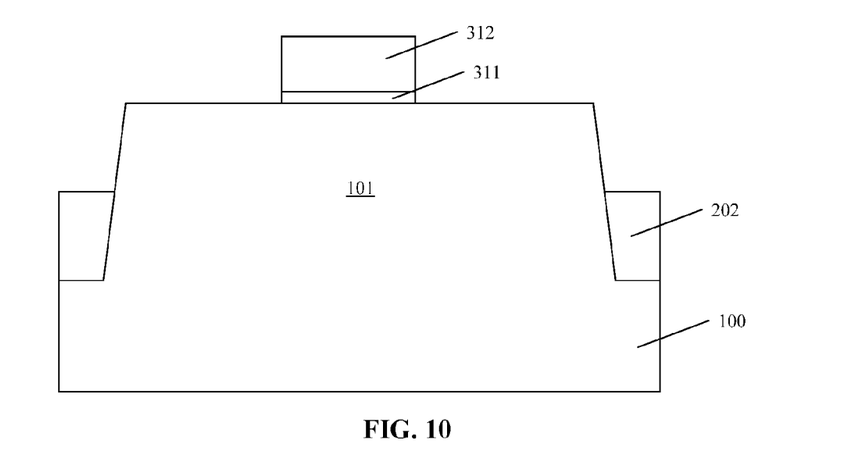
Figure 11:
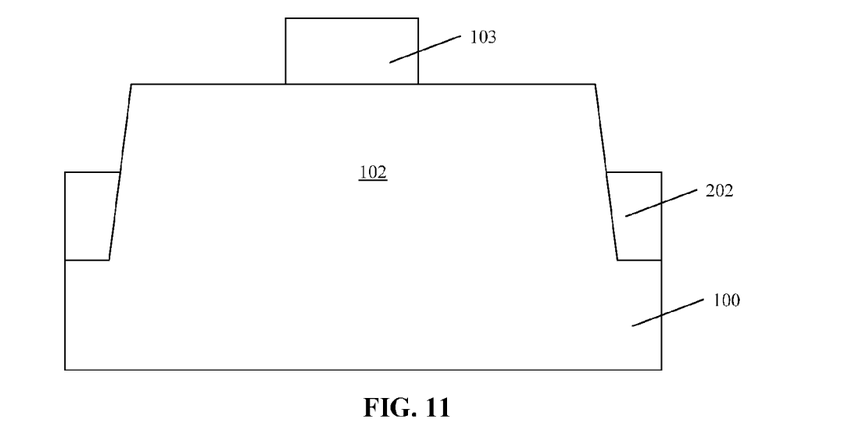

Returning to FIG. 24, after planarizing the dummy gate material layer 302, a first dummy gate structure and a second dummy gate structure may be formed (S108). FIGS. 8~11 illustrate a corresponding semiconductor structure. FIG. 9 illustrates a top view of the structure illustrated in FIG. 8; FIG. 10 illustrates a cross-sectional view of the structure illustrated in FIG. 8 along the AA' direction; and FIG. 11 illustrates a cross-sectional view of the structure illustrated in FIG. 8 along the BB' direction.

As shown in FIGS. 8~11, a first dummy gate structure (not labeled) is formed over the plurality of first fins 101 and on the insulation layer 202. The first dummy gate structure may cover the top and side surfaces of the first fins 101. Further, a second dummy gate structure (not labeled) is formed over the plurality of second fins 102 and on the insulation layer 202. The second dummy gate structure may cover only the side surfaces of the second fins 102. The top surface of the first dummy gate structure and the top surface of the second dummy gate structure may level with the top surface of the mask layer 103.

Further, the first dummy gate structure may include a first dummy gate dielectric layer 311; and a first dummy gate layer 312 formed on the first dummy dielectric layer 311. The second dummy gate structure may include a second dummy gate dielectric layer 321; and a second dummy gate layer 322 formed on the second dummy gate dielectric layer 321.

The first dummy gate structure may be formed by etching the dummy gate material layer 302 and the dummy gate dielectric layer 301 using a stacked mask layer (not labeled) as an etching mask. Referring to FIGS. 8~9, the stacked mask layer may include a silicon nitride layer 402 and a silicon oxide layer 403. In certain other embodiments, the stacked mask layer may be a single layer structure, or a multiple layer structure made of one or more of silicon oxide, silicon nitride and the silicon oxynitride, etc.

Referring to FIG. 8, before forming the stacked mask layer, a thermal oxide layer 401 may be formed on the dummy gate material layer 302 and the mask layer 103 by a thermal oxidation process. The thermal oxidation layer 401 may increase the quality of the interface between the dummy gate material layer 312 and the subsequently formed silicon nitride layer 402.

After forming the stacked mask layer, the stacked mask layer may be patterned; and followed by etching the dummy gate material layer 302 and the dummy gate dielectric material layer 301 using the patterned stacked mask layer as an etching mask. Thus, the first dummy gate structure and the second dummy gate structure may be formed.

In one embodiment, the mask layer 103 on the second fins 102 may also be etched. Thus, the remaining portions of the mask layer 103 may cover portions of the second fins 102.

FIG. 10 is a cross-sectional view of the structure illustrated in FIG. 8 along the AA' direction, in which the stacked mask layer and the thermal oxide layer 401 are omitted. As shown in FIG. 10, because the first dummy gate structure may be over the first fin 101; and cove a portion of the side and top surfaces of the first fin 101, along the AA' direction, a portion of the top surface of the first fin 101 may be covered by the first dummy gate structure having the first dummy gate dielectric layer 311 and the first dummy gate layer 312.

FIG. 11 is a cross-sectional view of the structure illustrated in FIG. 8 along the BB' direction, in which the stacked mask layer and the thermal oxide layer 401 are omitted. As shown in FIG. 11, because the mask layer 103 may be formed on the top surface of the second fin 102, along the BB' direction, a portion of the top surface of the second fin 102 may be covered by a portion of the mask layer 103.

The silicon nitride layer 402 and the silicon oxide layer 403 may be formed by any appropriate process, such as a CVD process, a PVD process, or an FCVD process, etc. Various processes may be used to pattern the silicon nitride layer 402 and the silicon oxide layer 403, such as a dry etching process, or a wet etching process, etc. The dummy gate material layer 302 and the dummy gate dielectric material layer may 301 may be etched by any appropriate process, such as a dry etching process, or a wet etching process, etc.

Figure 12:
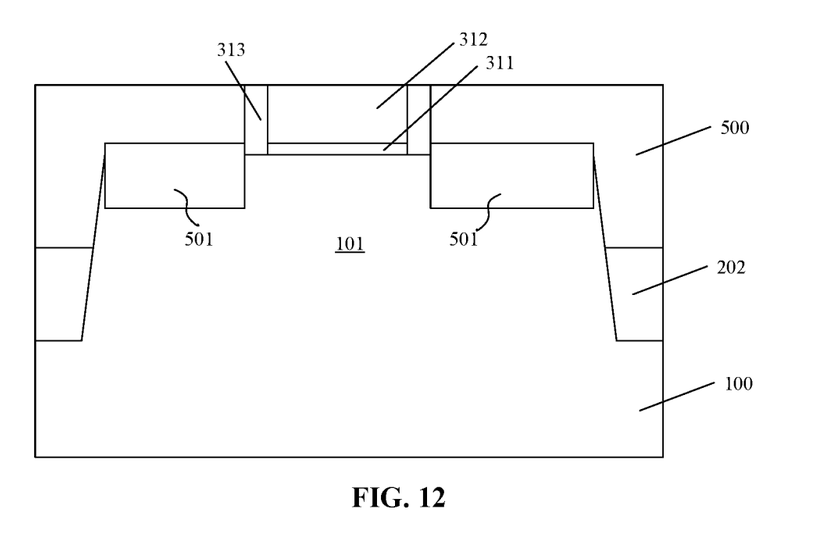
Figure 13:
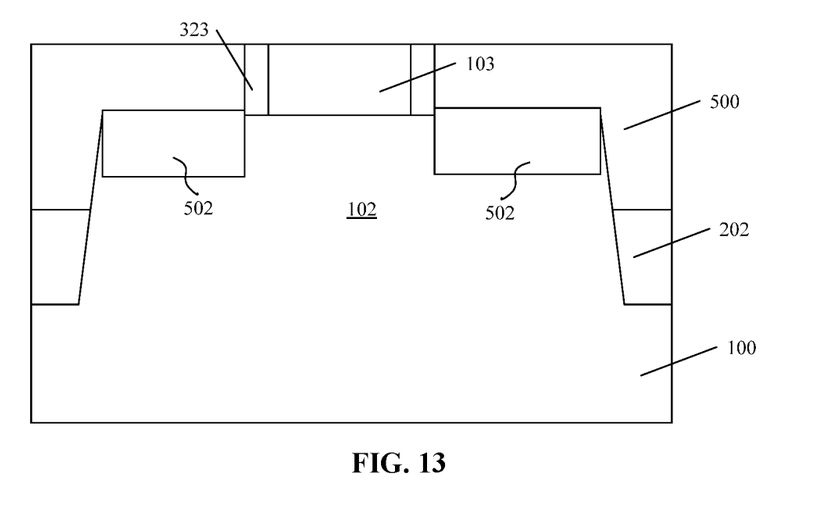

Returning to FIG. 24, after forming the first dummy gate structure and the second dummy gate structure, first source and drain regions, second source and drain regions and a first dielectric layer may be formed (S109). FIGS. 12~13 illustrate a corresponding semiconductor structure. FIG. 12 illustrates first source and drain regions and a first dielectric layer formed on the structure illustrated in FIG. 10; and FIG. 13 illustrates second source and drain regions and the first dielectric layer formed on the structure illustrated in FIG. 11.

As shown in FIGS. 12~13, first source and drain regions 501 are formed in the first fins 101 at both sides of the first dummy gate structure; and second source and drain regions 502 are formed in the second fins 102 at both sides of the second dummy gate structure. Further, a first dielectric layer 500 may be formed on the insulation layer 202. The top surface of the first dielectric layer 500 may level with the top surfaces of the first dummy gate structure and the second dummy gate structure; and may cover the side surfaces of the first dummy gate structure and the second dummy gate structure. Further, before forming the first source and drain regions 501, first sidewall spacers 313 may be formed on the side surfaces of the first dummy gate structure; and before forming the second source and drain regions 502, second sidewall spacers 323 may be formed on the side surfaces of the second dummy gate structure and the mask layer 103.

The first source and drain regions 501 and the second source and drain regions 502 may formed by any appropriate process. In one embodiment, the first source and drain regions 501 and the second source and drain regions 502 are formed by performing an ion implantation process on the first fins 101 and the second fins 102 using the first sidewall spacers 313, the first dummy gate structure, the second sidewall spacers 323 and the second dummy gate structure as a mask. Thus, the first source and drain regions 501 and the second source and drain regions 502 may be formed in the first fins 101 and the second fins 102 at both sides of the first dummy gate structure and the second dummy gate structure, respectively.

In certain other embodiments, the first source and drain regions 501 and the second source and drain regions 502 may be formed by forming trenches in the first fins 101 at both sides of the first dummy gate structure and forming trenches in the second fins 102 at both sides of the second dummy gate structure; and followed by forming stress material layers in the openings. Thus, the first source and drain regions 501 and the second source and drain regions 502 may be formed. The carrier mobility of the FinFETs having the first source and drain regions 501 and the second source and drain regions 502 formed by such a method may be increased.

The first dielectric layer 500 may be made of any appropriate material, such as silicon oxide, silicon nitride, porous silicon oxide, or silicon oxynitride, etc. Various processes may be used to form the first dielectric layer 500, such as a CVD process, a PVD process, or an FCVD process, etc.

Figure 14:
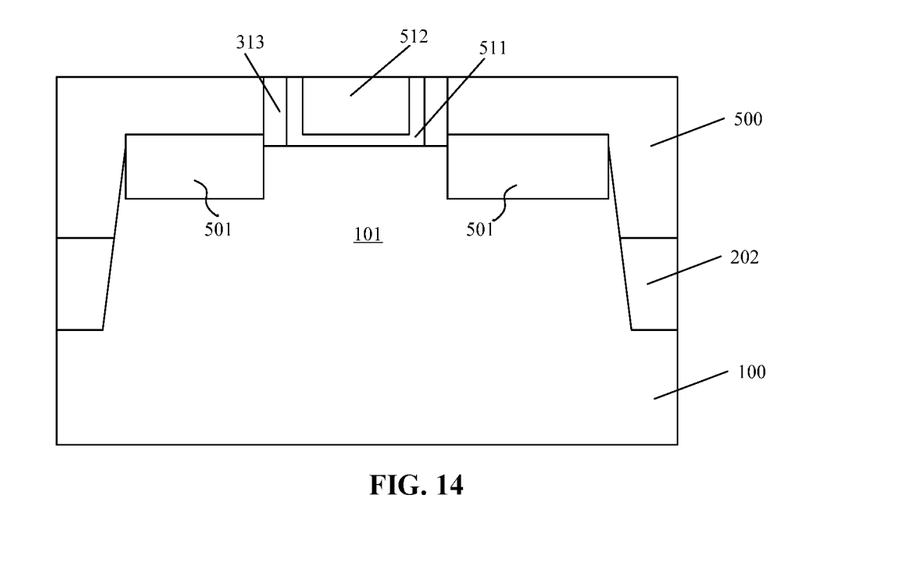
Figure 15:
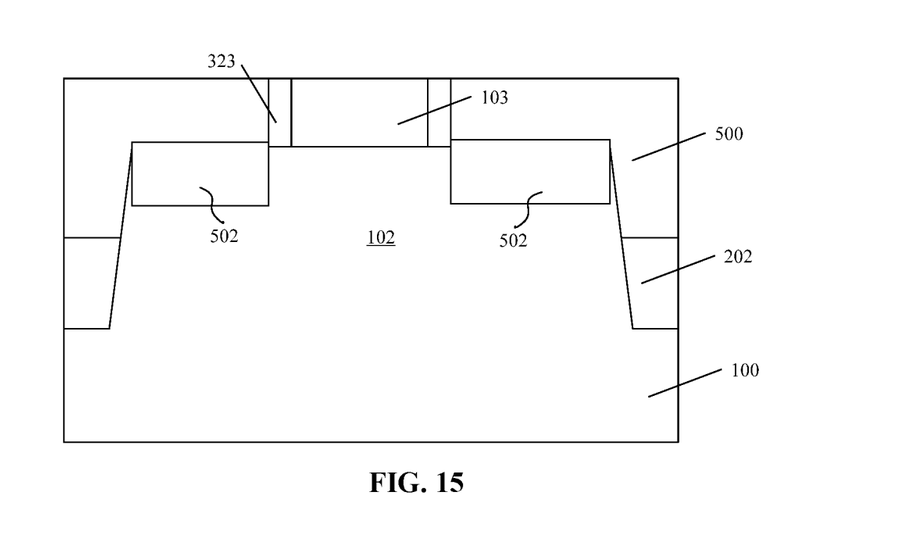
Figure 16:
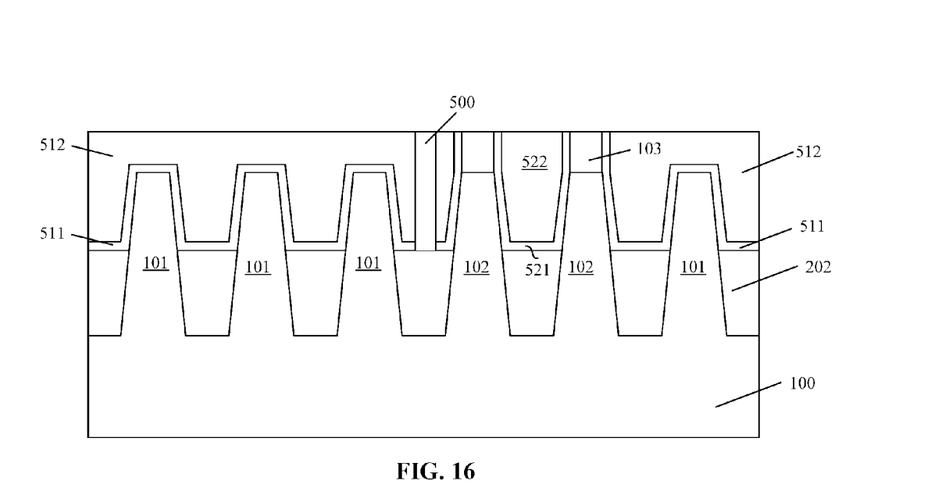

Returning to FIG. 24, after forming the first dielectric layer 500, a first gate structure and a second gate structure may be formed (S110). FIGS. 14~16 illustrate a corresponding structure. FIG. 16 illustrates a cross-sectional view of the semiconductor structure along a direction perpendicular with the first fins 101 and the second fins 102 after forming the first gate structure and the second gate structure.

As show in FIGS. 14~16, a first gate structure (not labeled) is formed over the first fins 101. The first gate structure may include a first gate dielectric layer 511 and a first gate layer 512 formed on the first gate dielectric layer 511. The first gate dielectric layer 511 may cover portions of the side surfaces and the top surfaces of one or more first fins 101. In one embodiment, as shown in FIG. 16, the first gate structure may cover three first fins 101. Thus, such a FinFET structure may be referred as a tri-gate FinFET.

As shown in FIG. 16, the second gate structure (not labeled) may include a second gate dielectric layer 521 and a second gate layer 522. Because the top surface of the second fin 102 may be covered by the mask layer 103, the second gate structure may only cover the side surfaces of the second fins 102. Thus, the second gate structure may be discontinuous. A portion of the second gate structure on one side surface of the second fin 102 may be used as the gate structure of the FinFET having the second fin 102. The other portion of the second gate structure on the other side surface of the second fin 102 may be used as a back-gate structure. Thus, the FinFET may be referred as a back-gate bias FinFET. By applying a back-bias on the back-gate structure, the threshold voltage of the FinFET may be adjusted.

In one embodiment, a process for forming the first gate structure and the second gate structure may include removing the first dummy gate structure and the second dummy gate structure to form a first trench and a second trench in the first dielectric layer 500. The first trench may expose the surfaces of portions of the first fins 101; and the second trench may expose the surfaces of the second fins 102 and the mask layer 103. After forming the first trench and the second trench, a gate dielectric material layer may be formed on the inner surfaces of the first trench and the second trench; and a gate material layer may be formed on the gate dielectric material layer. The gate material layer may fill the first trench and the second trench. Then, the gate dielectric material layer and the gate material layer may be planarized using the mask layer 103 as a stop layer. Thus, the first gate structure and the second gate structure may be formed in the first trench and the second trench, respectively.

The thickness of the mask layer 103 may determine the height of the first gate layer 512 on the first fins 101. In one embodiment, the thickness of the mask layer 103 may be in a range of approximately 500 Å~600 Å such that the first gate layer 512 may have a desired height.

The gate dielectric material layer may be made of any appropriate material. In one embodiment, the gate dielectric material layer may include a silicon oxide layer, and a high-K dielectric layer formed on the silicon oxide layer.

The gate material layer may be made of any appropriate material. In one embodiment, the gate material layer may include a dielectric cover layer, a work function layer formed on the dielectric cover layer; and a metal electrode layer formed on the work function layer.

The first dummy gate structure and the second dummy gate structure may be removed by any appropriate process, such as a dry etching process, or a wet etching process, etc. The gate dielectric material layer and the gate material layer may be formed by any appropriate process, such as a CVD process, a PVD process, or an ALD process, etc. Various processes may be used to planarize the gate dielectric material layer and the gate material layer, such as a chemical mechanical polishing process, or a physical mechanical polishing process, etc.

Figure 17:
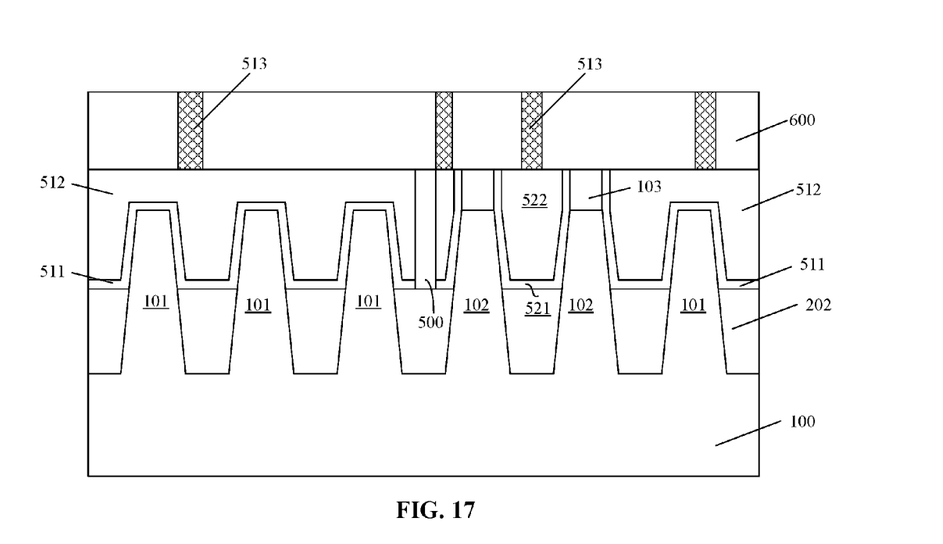

Returning to FIG. 24, after forming the first gate structure and the second gate structure, a second dielectric layer and a plurality of first metal contact vias may be formed (S111). FIG. 17 illustrates a corresponding semiconductor structure.

As shown in FIG. 17, a second dielectric layer 600 is formed on top surfaces of the first dielectric layer 500, the first gate layer 512, the mask layer 103 and the second gate layer 522. Further, a plurality of the first metal contact vias 513 may be formed in the second dielectric layer 600, and on the first gate layer 512 and the second gate layer 522.

The second dielectric layer 600 may be made of any appropriate material, such as silicon oxide, silicon nitride, silicon carbonitride, porous silicon oxide, or silicon oxynitride, etc. Various processes may be used to form the second dielectric layer 600, such as a CVD process, a FCVD process, or an ALD process, etc. In one embodiment, the second dielectric layer 600 is formed by a CVD process.

In one embodiment, a process for forming the plurality of the first metal contact vias 513 may include etching the second dielectric layer 600 to form a plurality of first through-holes exposing the first gate electrode layer 512 and the second gate electrode layer 522; and followed by filling the plurality of first through-holes with a metal material. Thus, the first metal contact vias 513 may be formed. The first metal contact vias 513 may be electrically connected with the first gate electrode layer 512 and the second gate electrode layer 522.

In one embodiment, the first mask layer 103 may be formed on the second fins 102. Thus, the second gate electrode layer 522 may be discontinuous at both sides of the second fins 102. That is, the second gate electrode layer 522 may be separated by the mask layer 103 on the second fins 102. It may need to form one first metal contact via 513 on the surface of the second gate electrode 522 at each side of the second fin 102. Bias voltages may be subsequently applied on the first metal contact vias 513 at both sides of the second fin 102, respectively. The portion of the second gate structure at one side of the second fin 102 may be used as a gate structure of the FinFET; and the portion of the second gate structure at the other side of the second fin 102 may be used a back-gate structure of the FinFET. A bias voltage may be applied on the back-gate structure of the FinFET through the first metal contact via 513 to adjust the threshold voltage of the FinFET. Thus, it may not need to dope the second fins 102 to adjust the threshold voltage of the FinFET. Accordingly, it may avoid the adverse effect to the carrier mobility of the second fins 102 caused by doping the second fins 102. It may also not need to form working function layers to adjust the threshold voltage of the FinFETs. Thus, the threshold voltage adjustment to the FinFETs having the second fins 102 may be relatively simple. Further, by applying different bias voltages on the back-gate structures of the FinFETs, the FinFETs may have different threshold voltages.

The first through holes in the second dielectric layer 600 may be formed by any appropriate process, such as a dry etching process, a wet etching process, or an ion beam etching process, etc. The first metal contact vias 513 may be made of any appropriate material, such as Cu, Al, or W, etc. Various processes may be used to form the first metal contact vias 513 in the first through-holes, such as a CVD process, a PVD process, an ALD process, or an electroplating process, etc.

Figure 18:
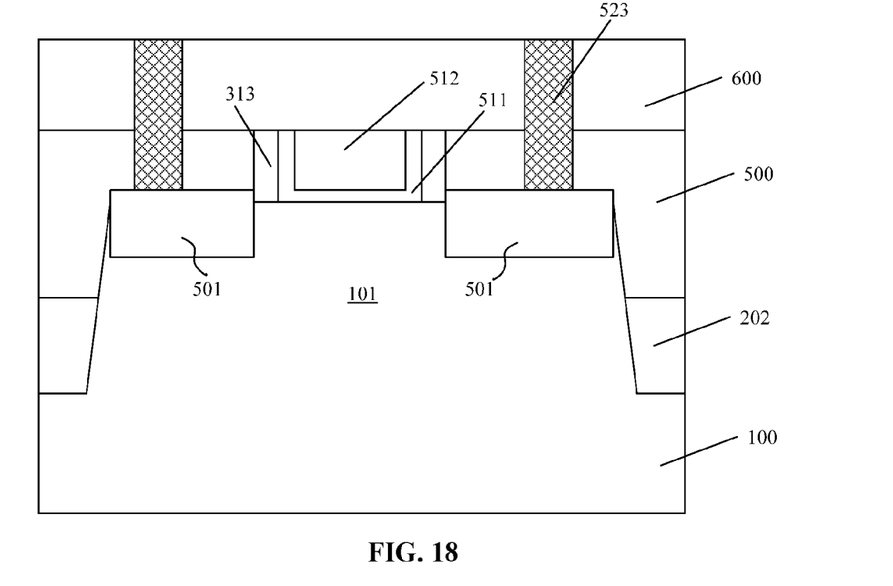
Figure 19:
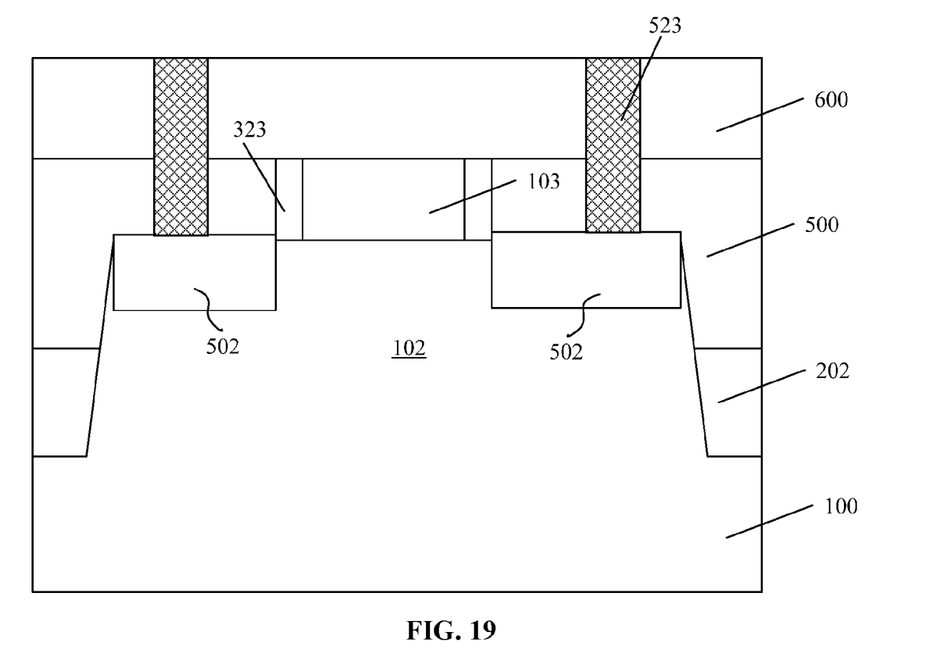

Returning to FIG. 24, after forming the first metal contact vias 513, a plurality of second metal contact vias may be formed (S112). FIGS. 18~19 illustrate a corresponding semiconductor structure. FIGS. 18~19 illustrate the semiconductor structure along the longitudinal direction of the first fin 101 and the second fin 102 after forming the second metal contact vias.

As shown in FIGS. 18~19, a second metal contact via 523 is formed on the surface of each of the first source and drain regions 501 and on the surface of each of the second source and drain regions 502. In one embodiment, the second metal contact vias 523 may be formed by etching the second dielectric layer 600 and the first dielectric 500 to form second through-holes (not labeled) to expose the surfaces of the first source and drain regions 501 and the surfaces of the second source and drain regions 502; and followed by filling a metal material in the second through-holes. Thus, the second metal contact vias 523 may be formed on the first source and drain regions 501 and the second source and drain regions 502 simultaneously.

The second through-holes may be formed by any appropriate process, such as a dry etching process, or a wet etching process, etc. The second contact vias 523 may be made of any appropriate material, such as Cu, Al, or W, etc. Various processes may be used to form the second metal contact vias 523 in the second through-holes, such as a CVD process, a PVD process, an ALD process, or an electroplating process, etc.

Thus, a semiconductor structure having a plurality of the FinFETs may be formed by the above disclosed processes and methods; and the corresponding FinFET structure is illustrated in FIGS. 17~19. As shown in FIGS. 17~19, the semiconductor structure may include a semiconductor substrate 100; and a plurality of first fins 101 and a plurality of second fins 102 formed on the semiconductor substrate 100. The semiconductor structure may also include a continuous first gate structure (not labeled) over a plurality of first fins 101 formed over the semiconductor substrate 100; and a discontinuous second gate structure (not labeled) formed on side surfaces of the second fins 102 and side surfaces of a mask layer 103 formed on the second fins 102, of which one portion formed on one side surface of the second fin 102 is used as a gate structure of a FinFET, and the other portion formed on the other side surface of the second fin 102 is used as a back-gate structure of the FinFET. Further, the semiconductor structure may include a plurality of first source and drain regions 501 formed in the first fins 101 at both sides of the first gate structure; and a plurality of second source and drain regions 502 formed in the second fins 102 at both sides of the second gate structure. Further, the semiconductor structure may also include an insulation layer 202 with top surfaces lower than the top surfaces of the first fins 101 and the second fins 102 formed on the semiconductor substrate 100; and a first dielectric layer 500 covering the side surfaces of portions first fins 101 and second fins 102, and the side surfaces of the first gate structure and the second gate structure, of which a top surface may level with the top surfaces of the first gate structure, the second gate structure and the mask layer 103. Further, the semiconductor structure may also include a second dielectric layer 600 formed on the first dielectric layer 500; and first metal contact vias 513 formed on the first gate structure in the second dielectric layer 600; and first metal contact vias formed on the second gate structure on each side of the second fin 102. Further, the semiconductor structure may also include a second metal contact via 523 formed on each of the first source and drain regions 501 and each of the second source and drain regions 502. The detailed structures and intermediate structures are described above with respect to the fabrication processes.

According to the disclosed methods and structures, the portion of the mask layer on the first fins may be removed; and the portion of the mask layer on the second fins may be kept. A continuous first gate structure may be formed over the plurality of first fins; and a discontinuous second gate structure may be formed on only side surfaces of the second fins. Further, the top surface of the first gate layer and the top surface of the second gate layer may level with the top surface of the mask layer. Thus, the first gate structure may be over the plurality of the first fins, and cover the top and side surfaces of the first fins; and the second gate structure may only cover the side surfaces of the second fins. The second gate structure at both sides of second fins may be insulated by the mask layer. The portion of the second gate structure at one side of the second fin may be used as the gate structure of the FinFET; and the portion of the second gate structure at the other side of the second fin may be used as a back-gate structure of the FinFET. A bias voltage may be applied on the back-gate structure of the FinFET to adjust threshold voltage of the FinFET having the second fin. Thus, the threshold voltage adjustment of the FinFET may be relatively convenient.

Figure 20:
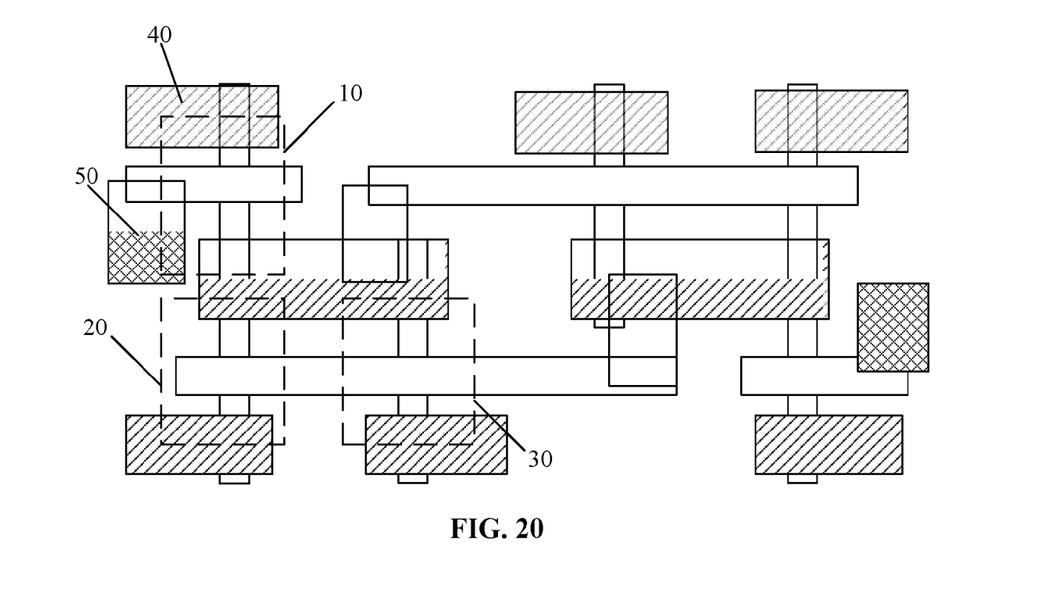
FIGS. 20~21 illustrate an exemplary static random access memory unit and a corresponding circuitry diagram consistent with the disclosed embodiments.
Figure 21:
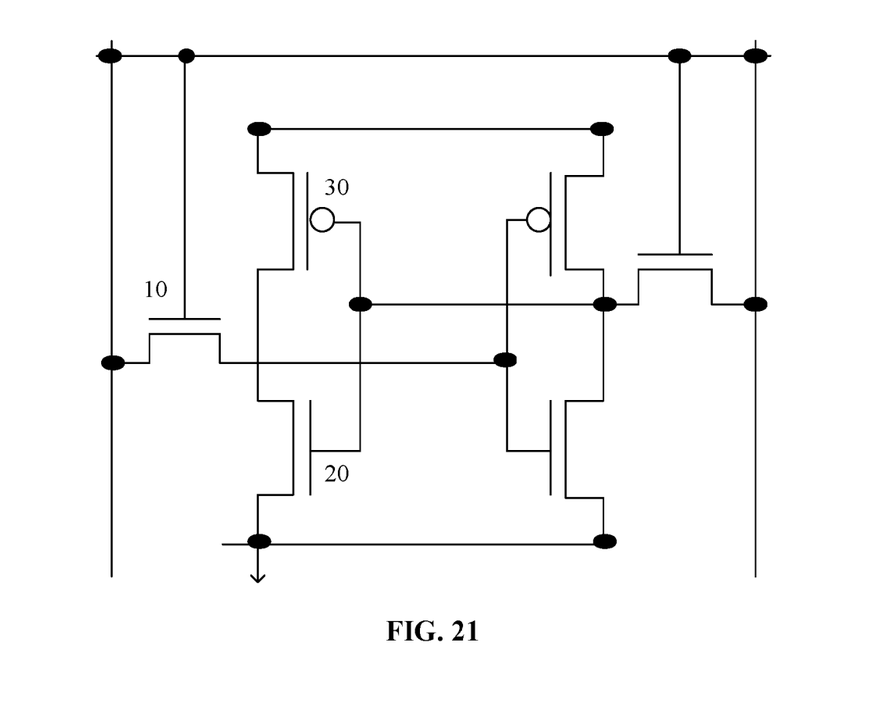

FIGS. 20~21 illustrate an exemplary static random access memory (SRAM) cell and the corresponding circuitry diagram consistent with the disclosed embodiments. As shown in FIGS. 20~21, the SRAM cell may include a pass-gate (PG) transistor 10, a pull-down (PD) transistor 20, a pull-up (PU) transistor 30, a plurality of first metal contacts 50 connecting with the gates of the PG transistor 10, the PD transistor 20 and the PU transistor 30; and a plurality of second metal contacts 40 connecting with the source/drain regions of the PG transistor 10, the PD transistor 20, and the PU transistor 30. The SRAM cell may also include another three transistors (not labeled) centrosymmetric with the PG transistor 10, the PD transistor 20 and the PU transistor 30.

In one embodiment, the PG transistor 10, the PD transistor 20 and the PU transistor 30 may be all FinFETs with a similar structure. For an SRAM cell formed by a high density of FinFETs, the read noise margin is an important parameter. The larger the read noise margin is, the higher the anti-interference ability of the SRAM cell is. A parameter representing the reading noise margin may be referred as β. β may be equal to the saturation current of the PD transistor divided by the saturation current of the PG transistor. Because the size of the fins of the FinFET may be substantially small, it may be difficult to change the size of the fins. Thus, the saturation current of the PG transistor 10, the saturation current of the PD transistor 20 and the saturation current of the PU transistor 30 may be similar. Accordingly, β may be equal to approximately 1.

In one embodiment, the channel region of the PG transistor 10 may be doped by an ion implantation process to increase the threshold voltage of the PG transistor 10. Accordingly, the saturation current of the PG transistor 10 may be reduced; and β may be increased.

Figure 22:
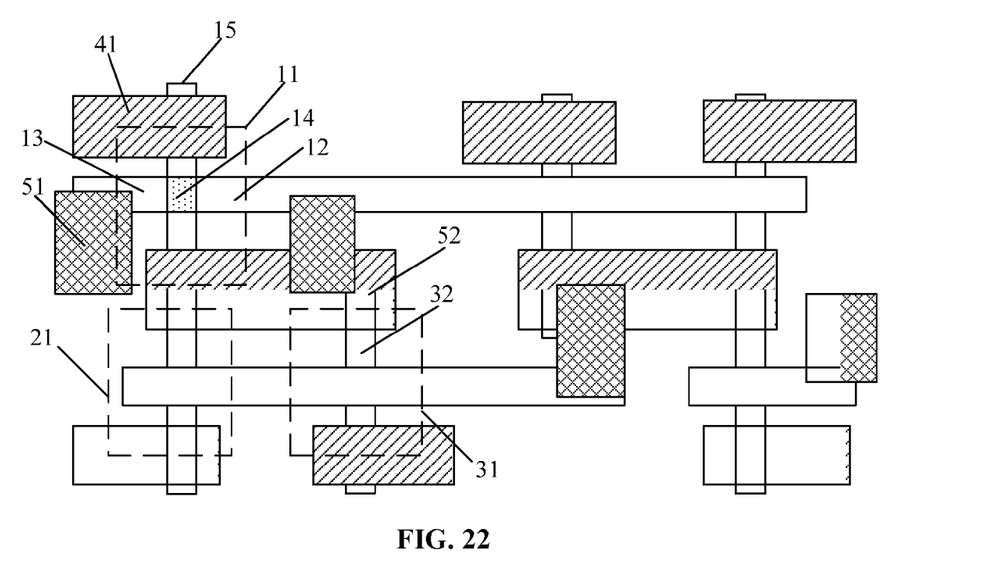
FIGS. 22~23 illustrate another exemplary static random access memory unit and a corresponding circuitry diagram consistent with the disclosed embodiments.
Figure 23:
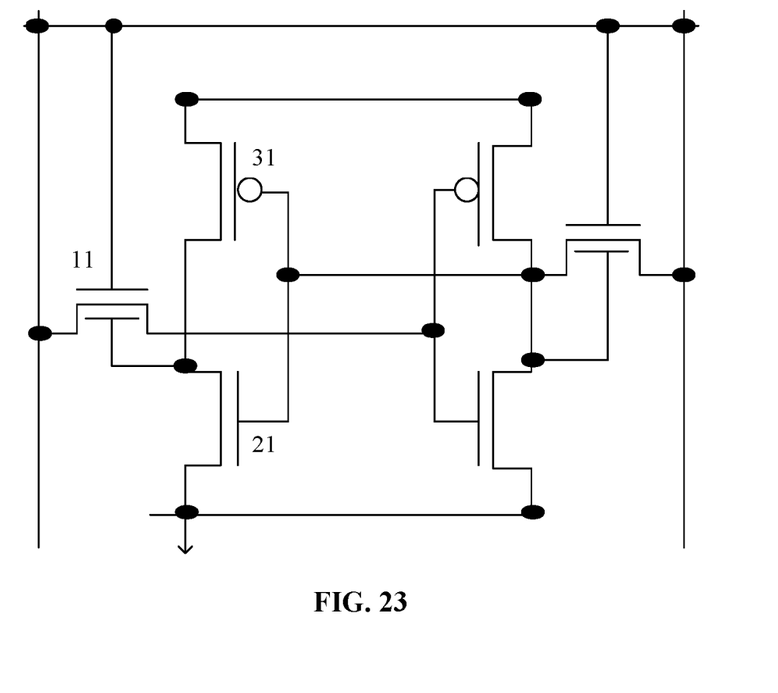

FIGS. 22~23 illustrate another exemplary static random access memory (SRAM) cell and the corresponding circuit consistent with the disclosed embodiments. As shown in FIGS. 22~23, the SRAM cell may include a pass-gate (PG) transistor 11. The PG transistor 11 may include a fin 15, a mask layer 14 covering the top of the fin 15, and a back-gate 12 and a gate 13 formed on the portions of two side surfaces of the fin 15 and two side surfaces of the mask layer 14, respectively. The top surfaces of the back-gate 12 and the gate 13 may level with the top surface of the mask layer 14. The gate 13 may be used as the gate of the PG transistor 11; and the back-gate 12 may be used to adjust the threshold voltage of the PG transistor 11.

Further, the SRAM cell may also include a pull-up (PU) transistor 31 and a pull-down (PD) transistor 21. The PU transistor 31 and the PD transistor 21 may be FinFETs. The gate of the PU transistor 31 and the gate of the PD transistor 21 may be electrically connected. In one embodiment, the gate of the PU transistor 31 and the gate of the PD transistor 21 may be continuous structures. That is, the gate of the PU transistor 31 and the gate of the PD transistor may cover a plurality of fins. For example, the gate of the PU transistor 31 and the gate of the PD transistor may cover three adjacent fins. Such transistors may be referred as tri-gate transistors.

Further, the back-gate 12 of the PG transistor 11 and the source 32 of the PU transistor 31 may be electrically connected. Thus, the source 32 of the PU transistor 31 may provide a feedback back-bias to the back-gate 12 of the PG transistor 11.

Referring to FIGS. 22~23, when the PG transistor 11 is at an "On" status, when the source 32 of the PU transistor 31 is at a low level, i.e., 0V, the voltage on the back-gate 12 of the PG transistor 11 is 0V, the PG transistor 11 is a single gate transistor with a constant threshold voltage at such conditions. The working current of the PG transistor 11 may be referred Ipg1. The working current may refer to the saturation current. When the source 32 of the PU transistor 31 is at a higher level, i.e., greater than 0V and smaller than 1V, the PU transistor 31 may be able to provide a back-bias greater than 0V to the back-gate 12 of the PG transistor 11. Thus, comparing with the status that the source 32 of the PU transistor 31 is at the low level, the threshold voltage of the PG transistor 11 may be increased. The working current of the PG transistor 11 at such a condition may be referred as Ipg2. The working current may refer to the saturation current. Thus, Ipg2 is greater than Ipg1. Because the bias voltage of the source 32 of the PU transistor 31 of the SRAM may vary between 0V and 1V, the working current of the PG transistor 11 may vary between Ipg1 and Ipg2.

The PD transistor 21 may be a regular multiple gate transistor with a working current Ipd; and the channel area of the PD transistor 21 may be greater than the channel area of the PG transistor 11. Because the larger the channel region of a transistor is, the larger the working current is, obviously, Ipd>Ipg1>Ipg2. The β of the SRAM cell may be between Ipd/Ipg and Ipd/Ipg2; and may be greater than 1. Thus, the noise readout margin of the SRAM Cell may be improved.

In one embodiment, by providing a back-bias to the back-gate 12 of the PG transistor 11 through the source 32 of the PU transistor 31, the threshold voltage of the PG transistor 11 may be increased. Thus, the saturation current of the PG transistor 11 may be reduced; and β of the SRAM cell may be increased. Accordingly, the anti-interference ability of the SRAM cell may be increased; and the stability of the SRAM cell may be enhanced. Further, such a method may not alter the structure and the area of the SRAM cell Further, referring to FIGS. 22~23, the SRAM cell may also include a third metal contact 51; a fourth metal contact 52; and metal connect lines 41, etc. In one embodiment, the third metal contact 51 connecting with the back-gate 12 of the PD transistor 11 may electrically connect with the fourth metal contact 52 connecting with the source 32 of the PU transistor 31. Thus, a back-bias may be provided to the back-gate 12 of the PG transistor 11 through the source 32 of the PU transistor 31.

In one embodiment, the mask layer 14 is made of silicon nitride. A thickness of the mask layer 14 may be in a range of approximately 500 Å~600 Å.

In one embodiment, the PD transistor 21 and the PD transistor 11 may share the same fin 15. Such a configuration may cause the drain of the PD transistor 11 to be connected with the source of the PD transistor 21. The source of the PD transistor 21 and the source 32 of the PU transistor 31 may be electrically connected through the fourth metal contact 52.

Further, the SRAM cell may include a structure centrosymmetric with the PG transistor 11, the PD transistor 21, the PU transistor 31, the third metal contact 51 and the fourth metal contact 52. That is, the SRAM may be a centrosymmetric structure having six transistors and a certain number of interconnect lines.

Thus, according to the disclosed structures and circuits, the source of the PU transistor of the SRAM cell may provide a back-bias to the back-gate of the PG transistor to reduce the saturation current of the PG transistor. Thus, the β of the SRAM cell may be increased; and the stability of the SRAM cell may be increased.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor structure having a plurality of FinFETs, comprising:
   providing a semiconductor substrate having a surface;
   forming a plurality of first fins and a plurality of second fins on the surface of the semiconductor substrate;
   forming a mask layer on top surfaces of the plurality of first fins and the plurality of second fins;
   forming an insulation material layer covering side surfaces of the first fins, the second fins and the mask layer;
   removing a portion of the mask layer on the first fins; and
   forming a continuous first gate structure covering side and top surfaces of a plurality of first fins and a discontinuous second gate structure covering only the side surfaces of the second fins and the side surfaces of the mask layer.

2. The method according to claim 1, wherein:
   a thickness of the mask layer is in a range of approximately 500 Å~600 Å.

3. The method according to claim 1, wherein removing the portion of the mask layer on the top surfaces of the first fins further comprises:
   forming a patterned mask layer exposing the portion of the mask layer on the first fins on the insulation material layer and the mask layer; and
   removing the portion of mask layer on the top surfaces of the first fins to expose the top surfaces of the first fins.

4. The method according to claim 1, after removing the portion of the first mask layer on the top surfaces of the first fins, further comprising:
   performing an etch-back process on the insulation material layer to form an insulation layer, of which a top surface is lower than the top surfaces of the first fins and the second fins.

5. The method according to claim 4, wherein forming the continuous first gate structure and the discontinuous second gate structure further comprises:
   forming a first dummy gate structure covering the side and top surfaces of the plurality of first fins and a second dummy gate structure covering the side surfaces of the plurality of second fins and the mask layer on the insulation layer;
   forming a first dielectric layer covering side surfaces of the first dummy gate structure and the second dummy gate structure on the insulation layer;
   removing the first dummy gate structure and the second dummy gate structure to from a first trench and a second trench, respectively; and
   forming the first gate structure in the first trench and the second gate structure in the second trench.

6. The method according to claim 5, wherein:
   the first dummy gate structure includes a first dummy gate dielectric layer and a first dummy gate layer formed on the first dummy gate dielectric layer; and
   the second dummy gate structure includes a second dummy gate dielectric layer and a second dummy gate layer formed on the second dummy gate dielectric layer.

7. The method according to claim 5, before forming the first dielectric layer, further comprising:
   forming first source and drain regions in the first fins at both sides of the first dummy gate structure; and
   forming second source and drain regions in the second fins at both sides of the second dummy gate structure.

8. The method according to claim 5, further comprising:
   forming first metal contact vias on the first source and drain regions; and
   forming second metal contact vias on the second source and drain regions.

9. The method according to claim 8, wherein forming the first metal contact vias and the second metal contact vias further comprises:
   forming a second dielectric layer on the first dielectric layer, the first gate structure and the second gate structure;
   etching the second dielectric layer to form first throughholes to expose the first gate structure and the second gate structure;

etching the second dielectric layer and the first dielectric layer to form second through-holes to expose the first source and drains and the second source and drain regions; and filling the first through-holes and the second through-holes with a metal material.

10. The method according to claim 8, wherein:

the first metal contact via on a portion of the second gate structure on one side surface of the second fin is used to apply a back-bias to adjust a threshold voltage of a FinFET formed by the second gate structure and the second fin.

* * * * *